(12) United States Patent
Kitahara

(10) Patent No.: US 8,282,744 B2
(45) Date of Patent: Oct. 9, 2012

(54) SUBSTRATE PROCESSING APPARATUS, SUBSTRATE PROCESSING METHOD, SUBSTRATE PROCESSING PROGRAM, AND COMPUTER READABLE RECORDING MEDIUM HAVING SUBSTRATE PROCESSING PROGRAM THEREIN

(75) Inventor: Shigenori Kitahara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 551 days.

(21) Appl. No.: 12/543,950

(22) Filed: Aug. 19, 2009

(65) Prior Publication Data
US 2010/0043830 A1  Feb. 25, 2010

(30) Foreign Application Priority Data

Aug. 20, 2008  (JP) ................. 2008-211952

(51) Int. Cl.
*B08B 3/00* (2006.01)
(52) U.S. Cl. ............ 134/26; 134/32; 134/34; 134/36; 134/42; 438/2; 438/3; 438/8; 438/9
(58) Field of Classification Search .......... 134/26, 134/32, 34, 36, 42; 137/2, 3, 4, 8, 9
See application file for complete search history.

(56) References Cited

U.S. PATENT DOCUMENTS

2003/0047191 A1* 3/2003 Liu .................. 134/1

FOREIGN PATENT DOCUMENTS

| JP | 2003-142448 A | 5/2003 |
| JP | 2005-093695 A | 4/2005 |
| JP | 2005-175183 A | 6/2005 |
| JP | 2007-123393 A | 5/2007 |

OTHER PUBLICATIONS

An Office Action dated Mar. 30, 2012, issued from the Japanese Patent Office (JPO) of Japanese Patent Application No. 2008-211952 and a partial English translation thereof.

* cited by examiner

*Primary Examiner* — Saeed T Chaudhry
(74) *Attorney, Agent, or Firm* — Abelman, Frayne & Schwab

(57) ABSTRACT

Disclosed is to supply processing liquid having a predetermined flow rate and concentration to substrate processing units of a substrate processing apparatus with high accuracy. The substrate processing apparatus, which processes substrates in the substrate processing units using the processing liquid supplied from a processing liquid supply part, sequentially carries the substrates to the respective substrate processing units, and controls the processing start time such that if the flow rate of the processing liquid used in one of the substrate processing units is less than the control flow rate that is controllable at the processing liquid supply part, the substrates are carried to the plurality of substrate processing units until a flow rate of the processing liquid reaches the control flow rate that is controllable at the processing liquid supply part and then the processing liquid is used simultaneously in the plurality of the substrate processing units.

5 Claims, 3 Drawing Sheets

SUBSTRATE PROCESSING APPARATUS, SUBSTRATE PROCESSING METHOD, SUBSTRATE PROCESSING PROGRAM, AND COMPUTER READABLE RECORDING MEDIUM HAVING SUBSTRATE PROCESSING PROGRAM THEREIN

This application is based on and claims priority from Japanese Patent Application No. 2008-211952, filed on Aug. 20, 2008, with the Japanese Patent Office, the disclosure of which is incorporated herein in its entirety by reference.

TECHNICAL FIELD

The present invention relates to a substrate processing apparatus, a substrate processing method, a substrate processing program, and a computer readable recording medium having a substrate processing program therein to process substrates in a plurality of substrate processing units by using processing liquid supplied from a processing liquid supply part.

BACKGROUND

Generally, various substrate treatments using a substrate processing apparatus have been performed to clean or etch a substrate, such as a semiconductor wafer or a liquid crystal substrate, for manufacturing a semiconductor component or a flat display respectively.

A substrate processing apparatus includes a plurality of substrate processing units that process substrates using processing liquid, and a processing liquid supply part, which supplies processing liquid to the substrate processing units. The processing liquid supply part produces the processing liquid that has been diluted in a predetermined concentration, and stores the diluted processing liquid. The processing liquid supply part supplies the processing liquid, previously diluted to the predetermined concentration, to the substrate processing units simultaneously, while processing the substrate. For example, see Japanese Laid-Open Patent Publication No. 2007-123393.

In the substrate processing apparatus, if the flow rate of the processing liquid in a substrate processing unit is low, the processing liquid supply part cannot control the flow rate of the processing liquid, thereby failing to supply the predetermined flow of the processing liquid with high accuracy.

In addition, if the substrate processing apparatus produces the processing liquid that has been diluted in a certain concentration, and supplies the diluted processing liquid to the substrate processing unit after the production, the flow rate of the diluted liquid may be extremely low. In such a case the processing liquid supply part would be unable to control the concentration, thereby failing to supply the predetermined concentration of the processing liquid with high accuracy.

If the processing liquid having the flow rate that is used by all substrate processing units is supplied at all the times, the excess processing liquid that is unused by substrate processing units can be wasted. Thus, the usage efficiency of the processing liquid can be deteriorated.

SUMMARY

According to one embodiment, a substrate processing apparatus is provided. The substrate processing apparatus includes a plurality of substrate processing units to process substrates using processing liquid, a processing liquid supply part to supply the processing liquid to the plurality of substrate processing units, and a control unit to control the respective substrate processing units and the processing liquid supply part. The control unit sequentially carries substrates to the respective substrate processing units, and controls a processing start time such that if a flow rate of processing liquid used in one of the substrate processing units is less than a control flow rate that is controllable at the processing liquid supply part, the substrates are carried to the plurality of the substrate processing units until the flow rate of processing liquid reaches the control flow rate that is controllable at the processing liquid supply part and then the processing liquid is used simultaneously in the plurality of the substrate processing units.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
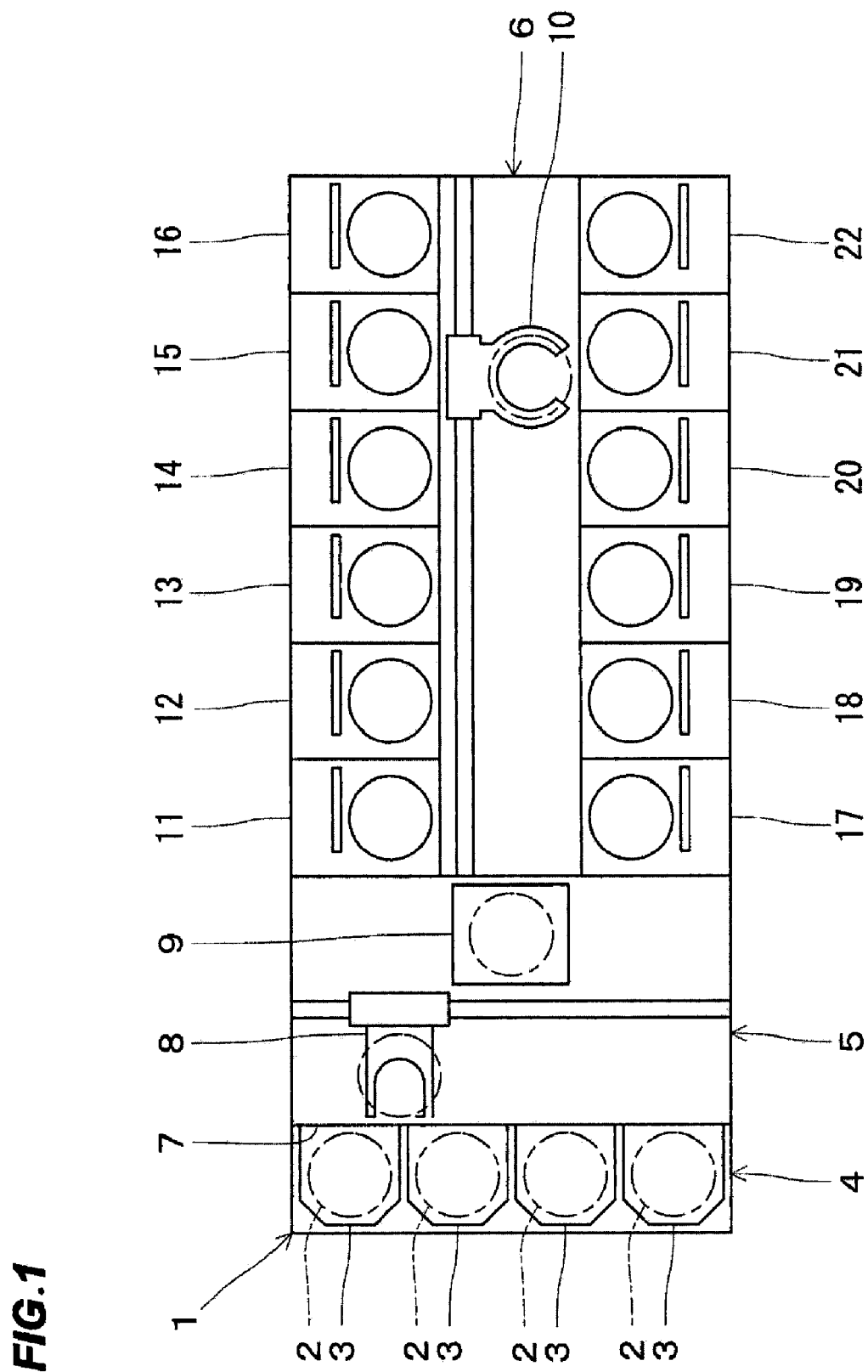
FIG. 1 is a plan view illustrating a substrate processing apparatus according to one embodiment of the present invention.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

According to one embodiment, a substrate processing apparatus is provided. The substrate processing apparatus includes a plurality of substrate processing units to process substrates using processing liquid, a processing liquid supply part to supply the processing liquid to the plurality of substrate processing units, and a control unit to control the respective substrate processing units and the processing liquid supply part. The control unit sequentially carries substrates to the respective substrate processing units, and controls a processing start time such that if a flow rate of processing liquid used in one of the substrate processing units is less than a control flow rate that is controllable at the processing liquid supply part, the substrates are carried to the plurality of the substrate processing units until the flow rate of processing liquid reaches the control flow rate that is controllable at the processing liquid supply part and then the processing liquid is used simultaneously in the plurality of the substrate processing units.

The processing liquid supply part may dilute a second fluid with a first fluid to produce a predetermined concentration of the processing liquid and supply the produced processing liquid to the substrate processing units after the production of the processing liquid. The control unit may control the processing start time such that if a flow rate of the second fluid contained in the predetermined concentration of the processing liquid used in one of the substrate processing units is less than the control flow rate of the second fluid that is controllable at the processing liquid supply part, the substrates are carried to the plurality of the substrate processing units until the flow rate of the second fluid reaches the control flow rate of the second fluid that is controllable at the processing liquid supply part, and then the processing liquid is used simultaneously in the plurality of the substrate processing units.

The control unit may control the processing start time such that multiple substrate processing units use the processing liquid simultaneously, and the number of the multiple substrate processing units using the processing liquid simultaneously may be determined such that the flow rate of the processing liquid used simultaneously in the multiple substrate processing units is substantially identical to the minimum control flow rate within the range of the control flow rate that is controllable at the processing liquid supply part.

According to another embodiment, a substrate processing method is provided. The substrate processing method includes supplying processing liquid from a processing liquid supply part, and processing substrates in a plurality of substrate processing units with the processing liquid. The method further comprises sequentially carrying the substrates to each of substrate processing units, and a processing start time is controlled such that if a flow rate of the processing liquid used in one of the substrate processing units is less than a control flow rate that is controllable at the processing liquid supply part, the substrates are carried to the plurality of the substrate processing units until the flow rate of the processing liquid reaches the control flow rate that is controllable at the processing liquid supply part, and then the processing liquid is used simultaneously in the plurality of substrate processing units.

The processing liquid supply part may dilute a second fluid with a first fluid to produce a predetermined concentration of the processing liquid and supply the produced processing liquid to the substrate processing units after the production of the processing liquid. The processing start time may be controlled such that if a flow rate of the second fluid contained in the predetermined concentration of the processing liquid used in one of the substrate processing units is less than the control flow rate of the second fluid that is controllable at the processing liquid supply part, the substrates are carried to the plurality of the substrate processing units until the flow rate of the second liquid reaches the control flow rate of the second fluid that is controllable at the processing liquid supply part, and then the processing liquid is use simultaneously in the plurality of the substrate processing units.

The processing start time may be controlled such that multiple substrate processing units use the processing liquid simultaneously, and the number of the multiple substrate processing units using the processing liquid simultaneously may be determined such that the flow rate of the processing liquid used simultaneously in the multiple substrate processing units is substantially identical to the minimum control flow rate within the range of the control flow rate that is controllable at the processing liquid supply part.

According to further another embodiment, there is provided with a substrate processing program allowing a substrate processing apparatus to process substrates. The substrate processing program includes instructions to supply processing liquid from a processing liquid supply part to a plurality of substrate processing units, and to process substrates in the plurality of substrate processing units with the supplied processing liquid. The program further includes an instruction to sequentially carry the substrates to each of substrate processing units, and a processing start time is controlled such that if a flow rate of the processing liquid used in one of the substrate processing units is less than a control flow rate that is controllable at the processing liquid supply part, the substrates are carried to the plurality of the substrate processing units until the flow rate of the processing liquid reaches the control flow rate that is controllable at the processing liquid supply part, and then the processing liquid is used simultaneously in the plurality of substrate processing units.

According to further yet another embodiment, there is provided with computer-readable recording medium having a substrate processing program to allow a substrate processing apparatus to process substrates. The program includes instructions to supply processing liquid from a processing liquid supply part to a plurality of substrate processing units, and to process substrates in the plurality of substrate processing units with the supplied processing liquid. The program further includes an instruction to sequentially carry the substrates to each of substrate processing units, and a processing start time is controlled such that if a flow rate of the processing liquid used in one of the substrate processing units is less than a control flow rate that is controllable at the processing liquid supply part, the substrates are carried to the plurality of the substrate processing units until the flow rate of the processing liquid reaches the control flow rate that is controllable at the processing liquid supply part, and then the processing liquid is used simultaneously in the plurality of substrate processing units.

According to one embodiment, a substrate processing apparatus is provided. The substrate processing apparatus processes substrates in a plurality of substrate processing units using processing liquid supplied from a processing liquid supply part. In the substrate processing apparatus, a processing start time is controlled such that the substrates are carried sequentially to the respective substrate processing units if a flow rate of the processing liquid used in one of the substrate processing units is less than the control flow rate that is controllable at the processing liquid supply part, and the substrates are carried to the plurality of the substrate processing units until the flow rate of the processing liquid reaches the control flow rate that is controllable at the processing liquid supply part and then the processing liquid is used simultaneously in the plurality of the substrate processing units if the flow rate of the processing liquid used in one of the substrate processing units is less than the control flow rate that is controllable at the processing liquid supply part. Therefore, the substrate processing apparatus can supply a predetermined flow rate of the processing liquid with high accuracy from the processing liquid supply part to the substrate processing units and improve the usage rate of the processing liquid used in the substrate processing apparatus to save the running costs of the substrate processing apparatus.

The substrate processing apparatus may dilute a second fluid with a first fluid to produce a predetermined concentration of the processing liquid and supply the produced processing liquid to the substrate processing units after the production of the processing liquid. In this case, if the flow rate of the second fluid contained in the predetermined concentration of the processing liquid used in one of the substrate processing units is less than the control flow rate of the second fluid that is controllable at the processing liquid supply part, the substrate processing apparatus controls the processing start time such that the substrates are carried to the plurality of the substrate processing units until the flow rate of the processing liquid reaches the control flow rate of the second fluid that is controllable at the processing liquid supply part and then the processing liquid is used simultaneously in the plurality of the substrate processing units. Thus, the substrate processing apparatus can supply the predetermined concentration of the processing liquid with high accuracy.

Hereinafter, a substrate processing apparatus, a substrate processing method used in the substrate processing apparatus, and a substrate processing program to execute a processing operation in the substrate processing apparatus according to embodiments will be described with reference to the accompanying drawings.

As shown in FIG. 1, a substrate processing apparatus 1 includes a substrate loading/unloading station 4 to collect a plurality of (for example, twenty five) substrates 2 (herein, semiconductor wafers) in its front end, and to load/unload substrates 2 to/from a carrier 3. Substrate processing apparatus 1 also includes a substrate carrying chamber 5 to carry substrates 2 received in carrier 3 one at a time behind substrate loading/unloading station 4. Substrate processing apparatus 1 further includes a substrate processing chamber 6 to perform various kinds of processing, such as cleaning or drying substrates 2, at a rear side of substrate carrying chamber 5.

Substrate loading/unloading station 4 is configured to load four carriers 3 in close contact with a front wall 7 of substrate carrying chamber 5 with transverse intervals between carriers 3.

Substrate carrying chamber 5 accommodates a substrate carrying device 8 and a substrate transfer station 9 therein. Substrate carrying chamber 5 is configured to carry substrates 2 one by one between any one of carriers 3 loaded on substrate loading/unloading station 4 and substrate transfer station 9 by using substrate carrying device 8.

A substrate carrying device 10 is accommodated in a center part of substrate processing chamber 6. Substrate processing chamber 6 arranges and accommodates first to sixth substrate processing units 11, 12, 13, 14, 15, and 16, front and back respectively, along a left side of substrate carrying device 10, and seventh to twelfth substrate processing units 17, 18, 19, 20, 21, and 22, front and back respectively, along a right side of substrate carrying device 10.

Further, substrate processing chamber 6 is configured to carry substrates 2 one by one between substrate transfer station 9 of substrate carrying chamber 5 and each of substrate processing units 11 to 22 using substrate carrying device 10, and to process substrates 2 using respective substrate processing units 11 to 22.

Figure 2:
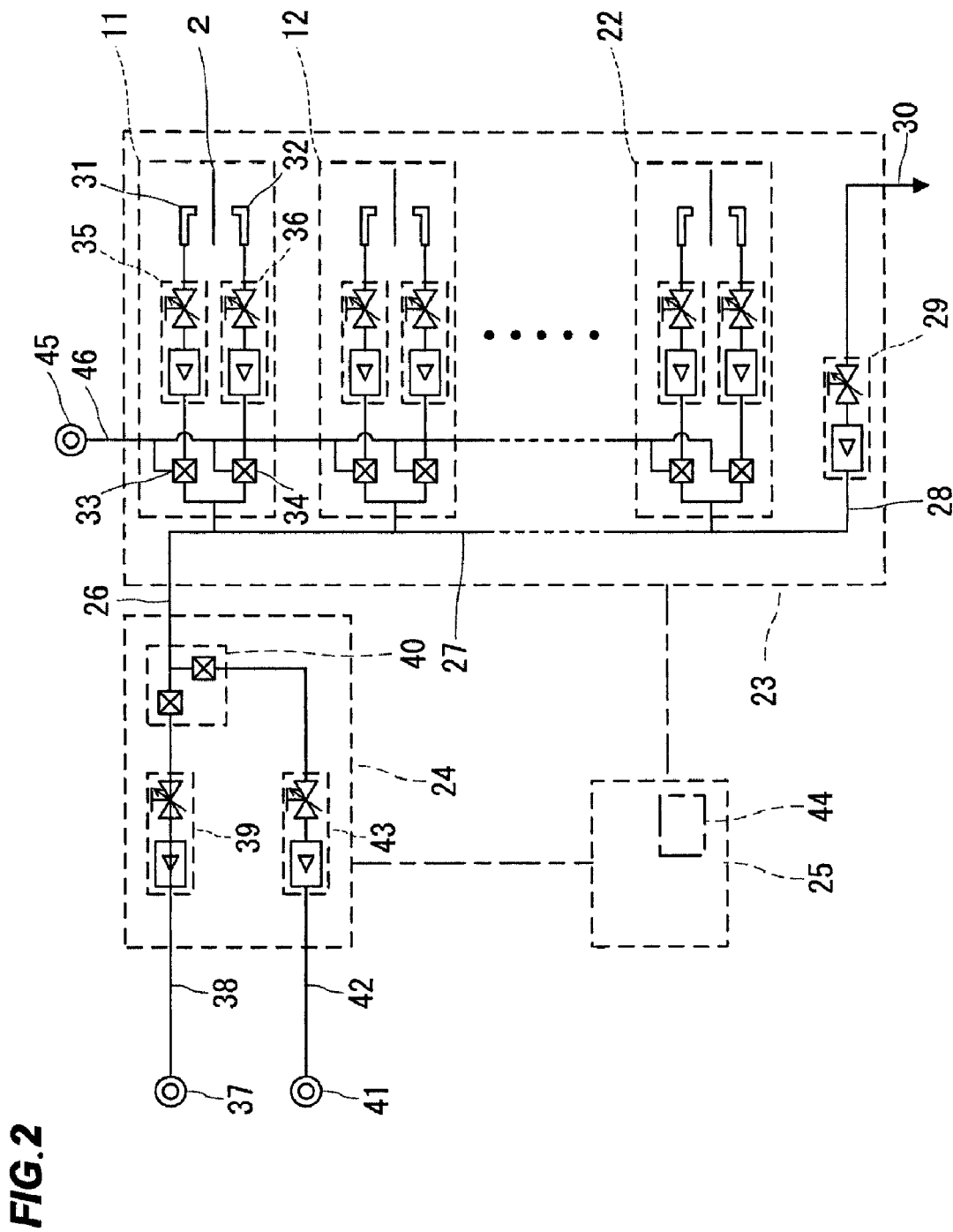
FIG. 2 is a block diagram of FIG. 1.

As shown in FIG. 2, substrate processing chamber 6 includes a processing unit 23 including first to twelfth substrate processing units 11 to 22, a processing liquid supply part 24 to supply processing liquid to processing unit 23, and a control unit 25 to control processing unit 23 and processing liquid supply part 24. Further, control unit 25 is configured to control the entire substrate processing apparatus 1 including substrate carrying devices 8 and 10.

In processing unit 23, a common supply pipe 27 is connected to an end of a connection pipe 26. Connection pipe 26 is connected to processing liquid supply part 24. A bypass pipe 28 is connected to an end of common supply pipe 27. Common supply pipe 27 is diverged and individually connected to each substrate processing unit 11 to 22, and carries the processing liquid from processing liquid supply part 24 to substrate processing units 11 to 22, respectively. Further, bypass pipe 28 is connected to a waste solution part 30 via a flow controller 29. Bypass pipe 28 is configured to discharge the remaining processing liquid that has not been used in substrate processing units 11 to 22 through waste solution part 30. Further, the flow rate of processing liquid discharged through waste solution part 30 is controlled by flow controller 29, which is controlled by control unit 25.

Each substrate processing unit, 11 to 22 is installed with a pair of nozzles 31 and 32 to discharge the processing liquid toward a surface or rear surface of substrate 2. Common supply pipe 27 is connected to each of nozzles 31 and 32 through switch valves 33 and 34 and flow controllers 35 and 36. Switch valves 33 and 34 are connected to a rinsing liquid source 45 to supply deionized water for rinsing (rinsing liquid) through a supply pipe 46. The deionized water is discharged from respective nozzles 31 and 32 through switching switch valves 33 and 34. Thus, a rinse processing is performed on substrate 2 (deionized water processing). The flow rate of the processing liquid or deionized water (the flow rate of the processing liquid used in respective substrate processing units 11 to 22) discharged from respective nozzles 31 and 32 is controlled in flow controllers 35 and 36 by means of control unit 25.

Processing liquid supply part 24 mixes first liquid and second liquid and dilutes the second liquid with the first liquid so as to produce the producing solution having a concentration. Processing liquid supply part 24 supplies the produced processing liquid to processing unit 23 through connection pipe 26 after producing the processing liquid. Hereinafter, it will be described that the deionized water is used as the first liquid, hydrofluoric acid is used as the second liquid, and the hydrofluoric acid is diluted by the deionized water at a ratio of 1/300, so as to produce the processing liquid.

In processing liquid supply part 24, a mixing part (mixing valve) 40 is connected to a deionized water supply pipe 38 through a flow controller 39. Deionized water supply pipe 38 is connected with a deionized water source 37 to supply the deionized water. Mixing part 40 is connected to a hydrofluoric acid supply pipe 42 through a flow controller 43. Hydrofluoric acid supply pipe 42 is connected with a hydrofluoric acid source 41 to supply the hydrofluoric acid, Mixing part 40 is connected to a leading end of the connection pipe 26. Also, a bombe or tank to collect the deionized water or the hydrofluoric acid may be used as deionized water source 37 or hydrofluoric acid source 41.

Further, in processing liquid supply part 24, the flow rate of the deionized water introduced into mixing part 40 from the deionized water supply pipe 38 and the flow rate of the hydrofluoric acid introduced into mixing part 40 from hydrofluoric acid supply pipe 42 are controlled by flow controllers 39 and 43, respectively, which are controlled by control unit 25. Thus, the processing liquid having the predetermined concentration and flow rate can be produced.

Figure 3:
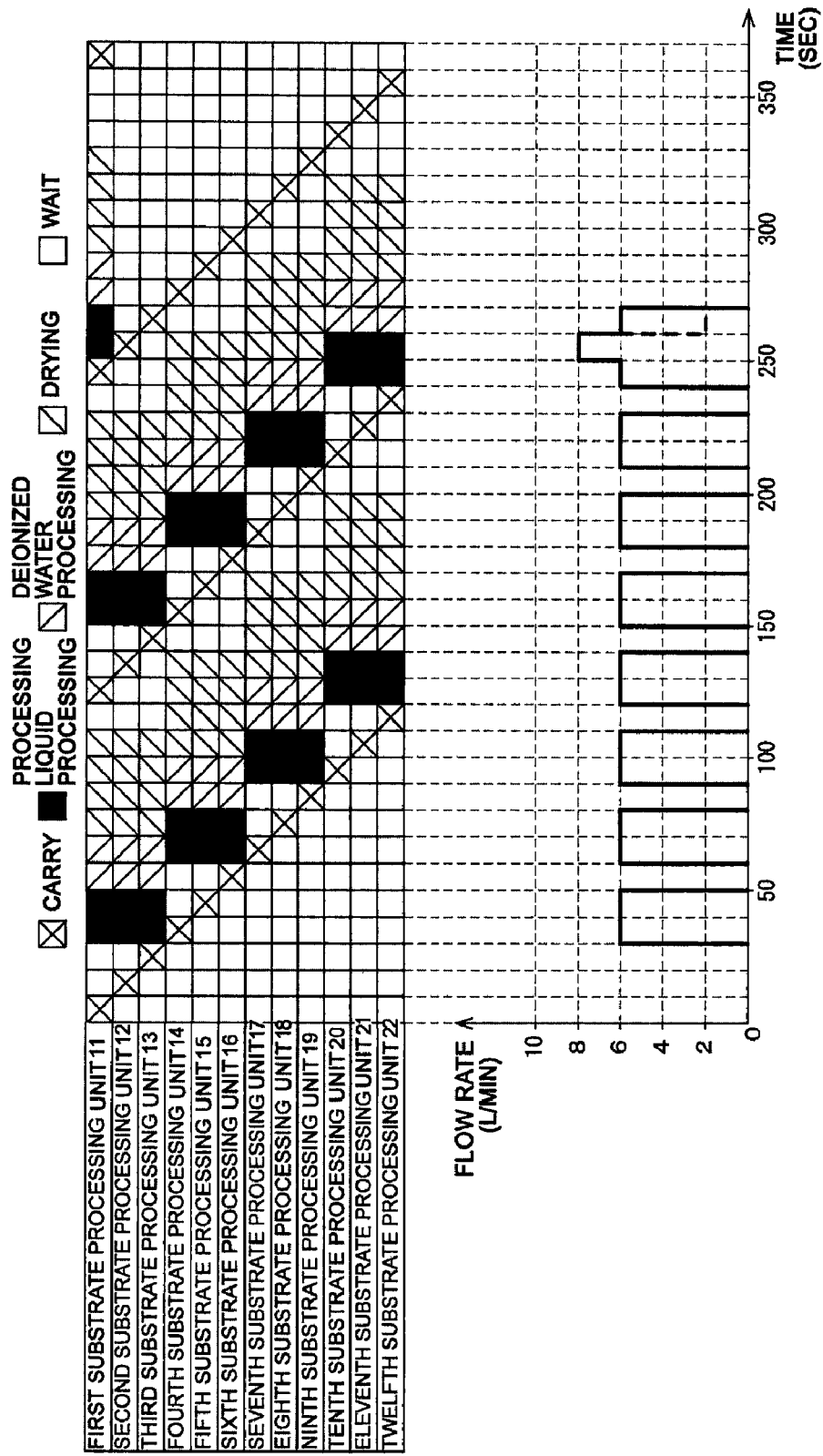
FIG. 3 is a schematic view illustrating the processing in a substrate processing apparatus according to one embodiment of the present invention.

Substrate processing apparatus 1, configured as described above, is controlled by a substrate processing program stored in a recording medium 44 embedded in control unit 25, as schematically shown in FIG. 3. Recording medium 44 may be any medium capable of storing the substrate processing program, such as a semiconductor memory-type memory medium, in the form of ROM and RAM, and a disc-type memory medium, such as a hard disc or CD-ROM.

According to the substrate processing program, substrate processing apparatus 1, as shown in FIG. 3, is controlled to receive twenty-five substrates 2 in carrier 3, which are sequentially processed in parallel by twelve substrate processing units 11 to 22. According to the substrate processing program, each of substrates 2 is carried to a respective substrate processing unit 11 to 22 for 10 seconds, and is processed by the processing liquid (processing liquid processing) for 20 seconds. Then, each of substrates 2 is processed by the deionized water (deionized water processing) for 20 seconds, and is dried for 40 seconds.

According to the substrate processing program, substrate carrying device 10 is controlled to carry substrates 2 sequentially to first to twelfth substrate processing units 11 to 22. If there is dried substrate 2 already in respective substrate processing unit 11 to 22, processed substrate 2 is unloaded and substrate 2 to be processed is loaded.

According to the substrate processing program with respect to the processing liquid processing of substrates 2, it is controlled that the processing liquid having the predetermined flow rate and concentration supplied from processing liquid supply part 24 is supplied to respective substrate processing units 11 to 22 and substrates 2 are processed by the processing liquid in respective substrate processing units 11 to 22.

According to the substrate processing program with respect to the deionized water processing of substrates 2, it is controlled that the predetermined flow rate of the deionized water supplied from rinsing liquid source 45 is supplied to respective substrate processing units 11 to 22 thereby processing substrates 2 in each substrate processing unit 11 to 22, respectively.

According to the substrate processing program with respect to the drying of substrates 2, it is controlled that the supply of the processing liquid or deionized water to respective substrate processing units 11 to 22 is stopped and substrates 2 are dried in respective substrate processing units 11 to 22.

According to the substrate processing program, it is controlled that 2 L/min of hydrofluoric acid, diluted with the deionized water at a ratio of 1/300, is used as the processing liquid in respective substrate processing units 11 to 22 during the processing liquid processing. Substrate processing apparatus 1 uses flow controller 43 that directs flow rates of 20 mL/min or more, and is installed at hydrofluoric supply pipe 42. Therefore, 20 mL/min of the hydrofluoric acid is converted into 6 L/min of the diluted processing liquid (6 L/min is 300 times 20 mL/min). As such, in substrate processing apparatus 1, the minimum control flow rate of the hydrofluoric acid (the second fluid) that is controllable at processing liquid supply part 24 is 20 mL/min and the minimum control flow rate of the processing liquid that is controllable at processing liquid supply part 24 is 6 L/min.

The usage rate of the processing liquid in each of substrate processing units 11 to 22 is 2 L/min (at which rate the usage rate of the hydrofluoric acid is 6.67 mL/min). If two or fewer of substrate processing units 11 to 22 are simultaneously used, the usage rate of the processing liquid is less than 6 L/min (20 mL/min of the minimum control flow rate of the hydrofluoric acid), which is the minimum control flow rate of the processing liquid that is controllable at processing liquid supply part 24. Thus, the substrate processing program controls such that three or more of substrate processing units 11 to 22 are used simultaneously, and by diluting at least 20 mL/min, which is the minimum control flow rate of the hydrofluoric acid controllable at processing liquid supply part 24, of the hydrofluoric acid with the deionized water, the predetermined concentration of 6 L/min, which is the minimum control flow rate of the processing liquid controllable at processing liquid supply part 24, or more of the processing liquid is produced and supplied to processing unit 23. As such, according to the substrate processing program, the processing start time is controlled such that if the flow rate of the processing liquid or hydrofluoric acid used by one of substrate processing units 11 to 22 is less than the control flow rate that is controllable at processing liquid supply part 24, the substrates are carried to substrate processing units 11 to 22 until the flow rate of the processing liquid or hydrofluoric acid reaches to the control flow rate that is controllable at processing liquid supply part 24, and then substrate processing units 11 to 22 use the processing liquid simultaneously.

The substrate processing program controls such that a substrate is carried to first substrate processing unit 11 for 10 seconds after the start of substrate processing. Another substrate is then carried to second substrate processing unit 12 between seconds 10 and 20 after processing has started, and a substrate is carried to third substrate processing unit 13 between seconds 20 and 30 after processing has started.

Next, the substrate processing program controls such that a substrate is carried to fourth substrate processing unit 14 and the substrates in first to third substrate processing units 11 to 13 are processed simultaneously with processing liquid between seconds 30 and 40 after processing has started.

Next, the substrate processing program controls such that a substrate is carried to fifth substrate processing unit 15 and the substrates in first to third substrate processing units 11 to 13 are processed simultaneously with the processing liquid between seconds 40 and 50 after the processing has started.

Next, the substrate processing program controls such that a substrate is carried to sixth substrate processing unit 16 and the substrates in first to third substrate processing units 11 to 13 are processed simultaneously with deionized water between seconds 50 and 60 after the processing has started.

Then, the substrate processing program controls such that a substrate is carried to seventh substrate processing unit 17, the substrates in first to third substrate processing units 11 to 13 are processed simultaneously with the deionized water, and the substrates in fourth to sixth substrate processing units 14 to 16 are processed simultaneously with the processing liquid between seconds 60 and 70 after the processing has started.

Then, likewise, the substrate processing program controls such that substrates are sequentially carried to first to twelfth substrate processing units 11 to 22 and the substrates are subjected to the processing liquid processing, deionized water processing, and drying simultaneously in three of substrate processing units 11 to 22 between seconds 70 and 250 after the processing has started.

Next, the substrate processing program controls such that the substrate is carried from second substrate processing unit 12 using substrate carrying device 10, the substrates in first substrate part 11 and tenth to twelfth substrate processing units 20 to 22 are processed simultaneously with the processing liquid, and the substrates in fourth to ninth substrate processing units 14 to 19 are dried between seconds 250 and 260 after the processing has started.

Next, the substrate processing program controls such that the substrate is carried from third substrate processing unit 13, and the substrate in first substrate processing unit 11 is processed with the processing liquid, the substrates in seventh to ninth substrate processing units 17 to 19 are dried simultaneously, and the substrates in tenth to twelfth substrate processing units 20 to 22 are processed simultaneously with the deionized water between seconds 260 and 270 after the processing has started. Since the processing liquid is used only in first substrate processing unit 11 between seconds 260 and 270 after the processing has started, the use rate of the processing liquid is 2 L/min. This flow rate is less than the minimum control flow rate of the processing liquid that is controllable at the processing liquid supply part 24. Therefore, the substrate processing program controls such that 4 L/min of processing liquid is produced as extra and total 6 L/min of processing liquid is supplied.

Then, likewise, the substrate processing program controls such that the substrates are carried from fourth to eighth substrate processing units 14 to 18, and the substrates in first substrate processing unit 11 and seventh to twelfth substrate processing units 17 to 22 are processed with the deionized water and are dried between seconds 270 and 320 after the processing has started.

Next, the substrate processing program controls such that the substrate is carried from ninth substrate processing unit 19 between seconds 320 and 330 after the processing has started, and the substrate is carried from tenth substrate processing unit 20 between seconds 330 and 340 after the processing has started, and the substrate is carried from the eleventh substrate processing unit 21 between seconds 340 and 350 after the processing has started, and the substrate is carried from twelfth substrate processing unit 22 between seconds 350 and 360 after the processing has started, and the substrate is carried from the first substrate processing unit 11 between seconds 360 and 370 after the processing has started.

As described above, since the flow rate (2 L/min) of the processing liquid used in one of substrate processing units 11 to 22 is less than the minimum flow rate (6 L/min) that is controllable at processing liquid supply part 24, the substrate processing program of substrate processing apparatus 1 controls the processing start time such that it waits until the flow rate of the processing liquid reaches the control flow rate (6 L/min or more) that is controllable at processing liquid supply part 24 and then the processing liquid is used simultaneously in the plurality (three or more) of the substrate processing units 11 to 22.

Accordingly, as shown in FIG. 3, substrate processing apparatus 1 produces 6L/min of processing liquid between seconds 30 and 50 after the processing has started, between seconds 60 and 80 after the processing has started, between seconds 90 and 110 after the processing has started, between seconds 120 and 140 after the processing has started, between seconds 150 and 170 after the processing has started, between seconds 180 and 200 after the processing has started, between seconds 210 and 230 after the processing has started, and between seconds 240 and 250 after the processing has started (as indicated by a solid line), and uses the entire processing liquid in substrate processing units 11 to 22. Also, substrate processing apparatus 1 produces 8 L/min of processing liquid between seconds 250 and 260 after the processing has started, and uses the entire processing liquid in substrate processing units 11 to 22. Further, substrate processing apparatus 1 produces 6 L/min of processing liquid between seconds 260 and 270 after the processing has started (as indicated by a solid line) and uses 2 L/min out of 6 L/min of processing liquid in substrate processing units 11 to 22 (indicated by a dotted line).

If a predetermined concentration of the processing liquid cannot be supplied since the flow rate of used processing liquid is less than the control flow rate that is controllable at processing liquid supply part 24, it may be considered that the flow rate of processing liquid used in all substrate processing units 11 to 22 is always supplied. However, in this case, the flow rate of processing liquid used in all twelve substrate processing units 11 to 22 is 24 L/min, and most of them are wasted, and the usage rate of processing liquid significantly decreases. In comparison to this, overall, 16.666 L of the processing liquid out of 17.333 L of the produced processing liquid is used and the remainder, only 0.666 L, of the processing liquid is wasted in substrate processing apparatus 1. Thus, the usage rate of the processing liquid is approximately 96% and most of the supplied processing liquid is used in substrate processing units 11 to 22 to improve the usage rate of the processing liquid.

As such, in substrate processing apparatus 1 to process substrates 2 in the plurality of substrate processing units 11 to 22 using the processing liquid supplied from processing liquid supply part 24, substrates 2 are sequentially carried to the respective substrate processing units 11 to 22, and if the flow rate of the processing liquid used in one of substrate processing units 11 to 22 is less than the control flow rate that is controllable in processing liquid supply part 24, the processing start time is controlled such that substrates 2 are carried to the plurality of substrate processing units 11 to 22 until the flow rate of processing liquid reaches the control flow rate that is controllable at the processing liquid supply part 24 and then the processing liquid is used simultaneously in the plurality of substrate processing units 11 to 22. Therefore, substrate processing apparatus 1 can supply the predetermined flow rate of processing liquid from processing liquid supply part 24 to substrate processing units 11 to 22 with high accuracy, improve the usage rate of the processing liquid used in substrate processing apparatus 1, and save the running costs of substrate processing apparatus 1.

Substrate processing apparatus 1 dilutes the second fluid with the first fluid so as to produce a predetermined concentration of the processing liquid and supplies the produced processing liquid to substrate processing units 11 to 22 after the production of the processing liquid. If the flow rate of the second fluid contained in the predetermined concentration of the processing liquid used in one of substrate processing units 11 to 22 is less than the control flow rate of the second fluid that is controllable at processing liquid supply part 24, the processing start time is controlled such that substrates 2 are carried to the plurality of substrate processing units 11 to 22 until the flow rate of the second fluid reaches the control flow rate of the second fluid that is controllable at processing liquid supply part 24, and then the processing liquid is used simultaneously in the plurality of substrate processing units 11 to 22. Thus, it is possible to supply the predetermined concentration of the processing liquid with high accuracy.

Further, if the flow rate of the processing liquid or the second fluid used in one of substrate processing units 11 to 22 is less than the control flow rate that is controllable at processing liquid supply part 24, the processing liquid may be used simultaneously in the plurality of substrate processing units 11 to 22 such that the flow rate of the processing liquid reaches the control flow rate that is controllable at processing liquid supply part 24. However, if the number of substrate processing units 11 to 22 used simultaneously increases, the waiting time period from the carrying to the processing liquid processing may increase and throughput of substrate processing apparatus 1 may decrease. Therefore, if multiple substrate processing units 11 to 22 use the processing liquid simultaneously where the number of the multiple substrate processing units 11 to 22 is determined such that the flow rate of the processing liquid used simultaneously in multiple substrate processing units 11 to 22 is substantially identical to the minimum control flow rate within the range of the control flow rate of the processing liquid that is controllable at processing liquid supply part 24, the throughput of substrate processing apparatus 1 may be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
 supplying processing liquid from a processing liquid supply part; and processing a plurality of substrates in a plurality of substrate processing units with the processing liquid, wherein the method further comprises sequentially carrying the substrates to each of the substrate processing units, a processing start time in each of the substrate processing units is controlled such that if a flow rate of the processing liquid used in a single substrate processing unit is less than a controllable flow rate at the processing liquid supply part, the substrates are continuously carried to a predetermined number of the substrate processing units until a combined flow rate of the processing liquid used in the predetermined number of the substrate processing units reaches the controllable flow rate at the processing liquid supply part, and then the processing liquid is used simultaneously in the predetermined number of the substrate processing units, the processing liquid supply part dilutes a second fluid with a first fluid to produce a predetermined concentration of the processing liquid and supply the produced processing liquid to the substrate processing units after the production of the processing liquid, and the processing start time is controlled such that if a flow rate of the second fluid contained in the predetermined concentration of the processing liquid used in one of the substrate processing units is less than the control flow rate of the second fluid that is controllable at the processing liquid supply part, the substrates are carried to the plurality of the substrate processing units until the flow rate of the second liquid reaches the control flow rate of the second fluid that is controllable at the processing liquid supply part, and then the processing liquid is use simultaneously in the plurality of the substrate processing units.

2. The substrate processing method of claim 1, the processing start time is controlled such that multiple substrate processing units use the processing liquid simultaneously, and the number of the multiple substrate processing units using the processing liquid simultaneously is determined such that the flow rate of the processing liquid used simultaneously in the multiple substrate processing units is substantially identical to the minimum control flow rate within the range of the control flow rate that is controllable at the processing liquid supply part.

3. The substrate processing method of claim 1, the processing start time is controlled such that multiple substrate processing units use the processing liquid simultaneously, and the number of the multiple substrate processing units using the processing liquid simultaneously is determined such that the flow rate of the processing liquid used simultaneously in the multiple substrate processing units is substantially identical to the minimum control flow rate within the range of the control flow rate that is controllable at the processing liquid supply part.

4. A substrate processing program allowing a substrate processing apparatus to process substrates, the substrate processing program comprising instructions to:

supply processing liquid from a processing liquid supply part to a plurality of substrate processing units; and process a plurality of substrates in the plurality of substrate processing units with the supplied processing liquid, wherein the program further comprises an instruction to sequentially carry the substrates to each of the substrate processing units, and a processing start time in each of the substrate processing units is controlled such that if a flow rate of the processing liquid used in a single substrate processing unit is less than a controllable flow rate at the processing liquid supply part, the substrates are continuously carried to a predetermined number of the substrate processing units until a combined flow rate of the processing liquid used in the predetermined number of the substrate processing units reaches the controllable flow rate at the processing liquid supply part, and then the processing liquid is used simultaneously in the predetermined number of the substrate processing units, the processing liquid supply part dilutes a second fluid with a first fluid to produce a predetermined concentration of the processing liquid and supply the produced processing liquid to the substrate processing units after the production of the processing liquid, and the processing start time is controlled such that if a flow rate of the second fluid contained in the predetermined concentration of the processing liquid used in one of the substrate processing units is less than the control flow rate of the second fluid that is controllable at the processing liquid supply part, the substrates are carried to the plurality of the substrate processing units until the flow rate of the second liquid reaches the control flow rate of the second fluid that is controllable at the processing liquid supply part, and then the processing liquid is use simultaneously in the plurality of the substrate processing units.

5. A computer-readable recording medium having a substrate processing program to allow a substrate processing apparatus to process substrates, the program comprising to instructions to:

supply processing liquid from a processing liquid supply part to a plurality of substrate processing units; and process a plurality of substrates in the plurality of substrate processing units with the supplied processing liquid, wherein the program further comprises an instruction to sequentially carry the substrates to each of the substrate processing units, and a processing start time in each of the substrate processing units is controlled such that if a flow rate of the processing liquid used in a single substrate processing unit is less than a controllable flow rate at the processing liquid supply part, the substrates are continuously carried to a predetermined number of the substrate processing units until a combined flow rate of the processing liquid used in the predetermined number of the substrate processing units reaches the controllable flow rate at the processing liquid supply part, and then the processing liquid is used simultaneously in the predetermined number of the substrate processing units, the processing liquid supply part dilutes a second fluid with a first fluid to produce a predetermined concentration of the processing liquid and supply the produced processing liquid to the substrate processing units after the production of the processing liquid, and the processing start time is controlled such that if a flow rate of the second fluid contained in the predetermined concentration of the processing liquid used in one of the substrate processing units is less than the control flow rate of the second fluid that is controllable at the processing liquid supply part, the substrates are carried to the plurality of the substrate processing units until the flow rate of the second liquid reaches the control flow rate of the second fluid that is controllable at the processing liquid supply part, and then the processing liquid is use simultaneously in the plurality of the substrate processing units.

* * * * *